United States Patent
Xie et al.

(10) Patent No.: US 9,799,676 B2
(45) Date of Patent: Oct. 24, 2017

(54) SEMICONDUCTOR DEVICE, FINFET TRANSISTOR AND FABRICATION METHOD THEREOF

(71) Applicant: Semiconductor Manufacturing International (Shanghai) Corporation, Shanghai (CN)

(72) Inventors: Xinyun Xie, Shanghai (CN); Ming Zhou, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/169,818

(22) Filed: Jun. 1, 2016

(65) Prior Publication Data
US 2016/0351591 A1    Dec. 1, 2016

(30) Foreign Application Priority Data
Jun. 1, 2015 (CN) .......................... 2015 1 0293006

(51) Int. Cl.
| | | |
|---|---|---|
| H01L 21/311 | (2006.01) | |
| H01L 21/302 | (2006.01) | |
| H01L 27/12 | (2006.01) | |
| H01L 21/84 | (2006.01) | |
| H01L 21/3065 | (2006.01) | |
| H01L 21/306 | (2006.01) | |
| H01L 21/02 | (2006.01) | |
| H01L 21/762 | (2006.01) | |
| H01L 29/06 | (2006.01) | |
| H01L 21/308 | (2006.01) | |
| H01L 23/367 | (2006.01) | |

(52) U.S. Cl.
CPC ...... *H01L 27/1211* (2013.01); *H01L 21/0214* (2013.01); *H01L 21/0234* (2013.01); *H01L 21/02238* (2013.01); *H01L 21/02252* (2013.01); *H01L 21/02332* (2013.01); *H01L 21/3065* (2013.01); *H01L 21/3086* (2013.01); *H01L 21/30604* (2013.01); *H01L 21/7624* (2013.01); *H01L 21/845* (2013.01); *H01L 29/0649* (2013.01); *H01L 23/367* (2013.01)

(58) Field of Classification Search
CPC ......... H01L 21/30604; H01L 21/30608; H01L 21/31144; H01L 21/3116; H01L 2224/03622
USPC ........ 438/689, 700, 706, 716, 717, 736, 745
See application file for complete search history.

(56) References Cited

U.S. PATENT DOCUMENTS 7,932,565 B2 *  4/2011  Wu .................... H01L 21/76232
                                                        257/374
9,349,658 B1 *  5/2016  Jacob .................... H01L 21/845

* cited by examiner

*Primary Examiner* — Hsien Ming Lee
(74) *Attorney, Agent, or Firm* — Anova Law Group, PLLC

(57) ABSTRACT

The present disclosure provides semiconductor devices, fin field-effect transistors and fabrication methods thereof. An exemplary fin field-effect transistor includes a semiconductor substrate; an insulation layer configured for inhibiting a short channel effect and increasing a heat dissipation efficiency of the fin field-effect transistor formed over the semiconductor substrate; at least one fin formed over the insulation layer; a gate structure crossing over at least one fin and covering top and side surfaces of the fin formed over the semiconductor substrate; and a source formed in the fin at one side of the gate structure and a drain formed in the fin at the other side of the gate structure.

14 Claims, 5 Drawing Sheets

SEMICONDUCTOR DEVICE, FINFET TRANSISTOR AND FABRICATION METHOD THEREOF

CROSS-REFERENCES TO RELATED APPLICATIONS

This application claims the priority of Chinese patent application No. 201510293006.7, filed on Jun. 1, 2015, the entirety of which is incorporated herein by reference.

FIELD OF THE INVENTION

The present invention generally relates to the field of semiconductor technology and, more particularly, relates to semiconductor devices, fin field-effect transistors and fabrication processes thereof.

BACKGROUND

With the rapid development of semiconductor manufacturing technology, the technical node of the conventional integrated circuits (ICs) has been continuously shrunk. The critical dimension (CD) of the IC devices has become smaller and smaller. Correspondingly, the fabrication technique of the IC devices has been continuously improved so as to enhance the performances of the IC devices.

For example, in an MOS transistor, a metal layer is usually formed between a high-dielectric constant (high-K) dielectric layer and a metal gate to obtain a desired threshold voltage to improve the device performance. However, with the continuous shrinking of the CD, the conventional planar MOS transistors are unable to match the performance requirements of IC devices. For example, the control ability of the planar CMOS transistors to their channel regions has become relatively weak; and a severe leakage current issue may occur. Thus, replacing the conventional CMOS transistors with multi-gate devices has attracted more and more attentions.

Figure 1:
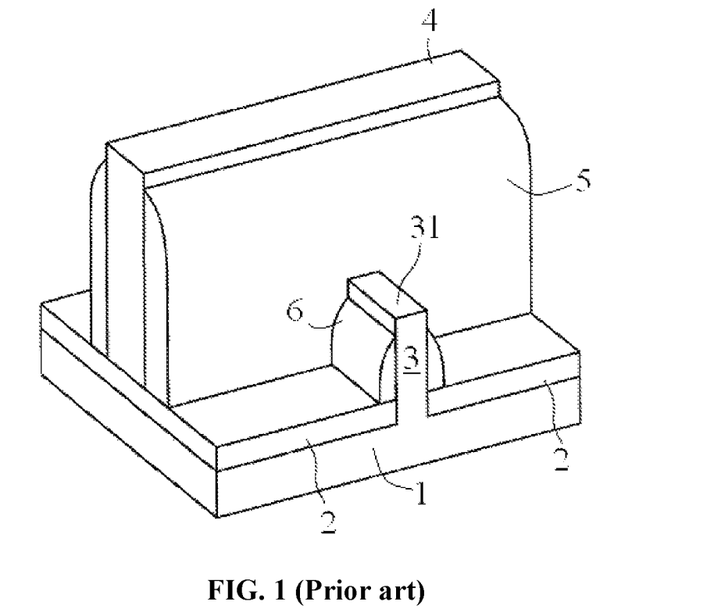
FIG. 1 illustrates an existing FinFET.

Fin field-effect transistors (FinFETs) are a typical type of multi-gate devices. FIG. 1 illustrates an existing FinFET. As shown in FIG. 1, the FinFET includes a semiconductor substrate 1; a fin 3 on the semiconductor substrate 1; a silicon oxide layer 2 on the semiconductor substrate 1; a gate dielectric layer (not shown) crossing over the fin 3 and a gate 4 on the silicon oxide layer 2; inter-fin sidewall spacers 6 at both sides of the fin 3 and gate sidewall spacers 5 on both sides of the gate 4; and source/drain 31 in the fin 3 at two sides of the gate 4 and the gate-sidewall spacer 5, respectively.

Portions of the top and two side surfaces of the fin 3 that are in contact with the gate 4 form a channel region of the FinFET. That is, such a device structure enables the FinFET to have the functions of multi-gates simultaneously. Thus, the drive current of the FinFET is increased; and the performance of the FinFET is enhanced.

However, with the continuous development of the IC technology, the CD of the devices is continuously reduced; and the device density is continuously increased. Thus, higher requirements of ICs have been brought out. Therefore, the existing FinFETs may be unable to match the development of the ICs. The disclosed device structures and methods are directed to solve one or more problems set forth above and other problems in the art.

BRIEF SUMMARY OF THE DISCLOSURE

One aspect of the present disclosure includes a method for fabricating a semiconductor device. The method includes providing a semiconductor substrate having a surface; forming at least one fin over the surface of the semiconductor substrate; forming a mask layer on side surfaces of the fin; forming insulation layer trenches in the semiconductor substrate by etching the semiconductor substrate using the mask layer as an etching mask; forming silicon oxide layers on the side surfaces of the insulation trenches under the fins; forming first nitrogen-doped silicon oxide layers by doping nitrogen into the silicon oxide layers; and filling the insulation layer trenches with nitrogen-doped silicon oxide to form second nitrogen-doped silicon oxide layers. The first nitrogen-doped silicon oxide layers and the second nitrogen-doped silicon oxide layers form an insulation layer under the fin to inhibit a short channel effect and increase a heat dissipation efficiency of the semiconductor device.

Another aspect of the present disclosure includes a semiconductor device. The semiconductor device comprises a semiconductor substrate; an insulation layer configured for inhibiting a short channel effect and increasing a heat dissipation efficiency of the semiconductor device formed over the semiconductor substrate; and at least one fin formed over the insulation layer.

Another aspect of the present disclosure includes a fin field-effect transistor. The fin field-effect transistor includes a semiconductor substrate; an insulation layer configured for inhibiting a short channel effect and increasing a heat dissipation efficiency of the fin field-effect transistor formed over the semiconductor substrate; at least one fin formed over the insulation layer; a gate structure crossing over at least one fin and covering side and top surfaces of the fin formed over the semiconductor substrate; and a source formed in the fin at one side of the gate structure and a drain formed in the fin the other side of the gate structure.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The existing FinFETs may have a relatively severe short channel effect and leakage current issue. Thus, the performance of the FinFETs may be adversely affected; and the FinFETs may be unable to match the performance requirements for developing ICs. Further, the existing FinFETs may accumulate a large amount of heat inside, i.e., self-heating effect, during the operation. The relatively bad heat dissipation may also affect the performance of the FinFET.

The leakage current issue of the FinFET may be caused by the relatively weak control ability of the gate to the carriers under the fin. The accumulation of the relatively large amount of heat may be caused by the structure of the existing FinFET. Silicon oxide may be used as the insulation material between the channel regions of adjacent FinFETs. The heat dissipation ability of silicon oxide may be relatively weak. Thus, when the FinFET is in operation, the generated heat may not be dissipated timely; and the heat may be accumulated in the FinFET. According to the disclosed device structures and methods, such issues may be overcome by forming an insulation layer under the channel region of the FinFET.

Figure 14:
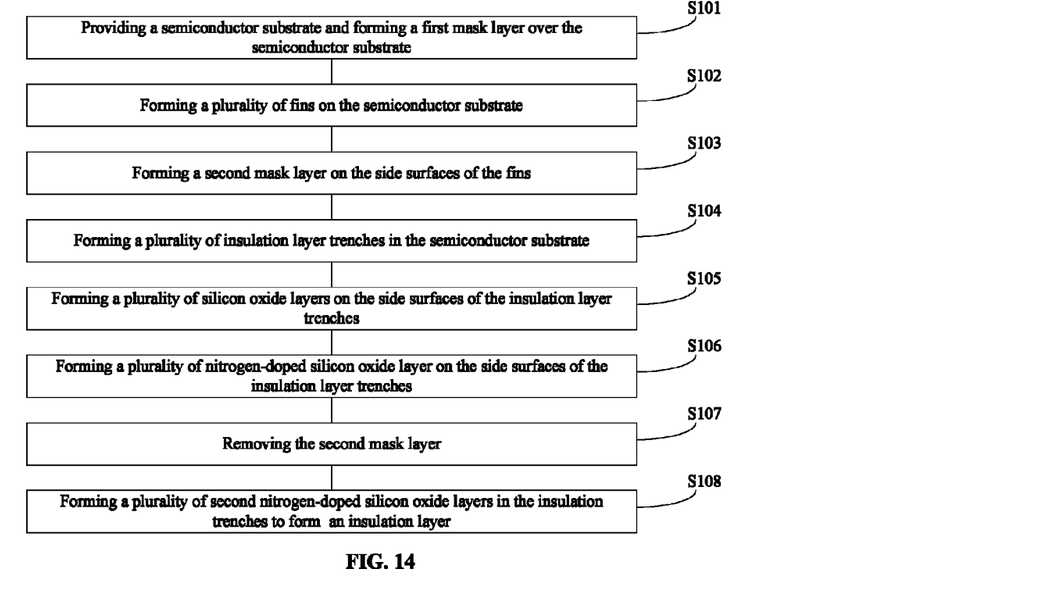
FIG. 14 illustrates an exemplary fabrication process of a semiconductor device consistent with the disclosed embodiments.

FIG. 14 illustrates an exemplary fabrication process of a semiconductor device consistent with the disclosed embodiments; and FIGS. 2-11 illustrate semiconductor structures corresponding to certain stages of the exemplary fabrication process.

Figure 2:
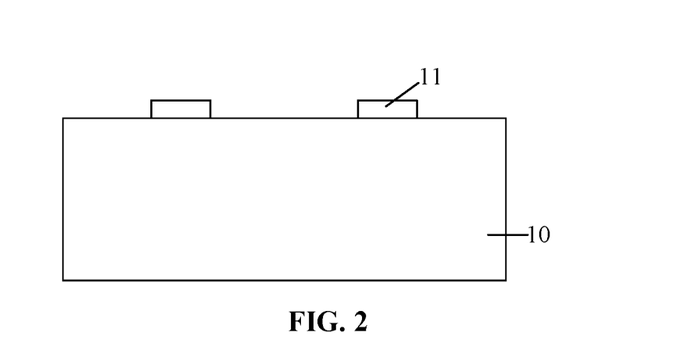
FIGS. 2-11 illustrate semiconductor structures corresponding certain stages of an exemplary fabrication process of a semiconductor device consistent with the disclosed embodiments.

As shown in FIG. 14, at the beginning of fabrication process, a semiconductor substrate with certain structures is provided (S101). FIG. 2 illustrates a corresponding semiconductor structure.

As shown in FIG. 2, a semiconductor substrate 10 is provided. Further, a first mask layer 11 may be formed on the semiconductor substrate 10.

The semiconductor substrate 10 may be made of any appropriate semiconductor material, such as silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor, or a combination thereof. In one embodiment, the semiconductor substrate 10 is made of silicon. The semiconductor substrate 10 provides a base for subsequent structures and processes.

Well regions (not shown) may be formed in the semiconductor substrate 10. The well regions may be P-type well regions or N-type well region according to the type of the final FinFET.

The process for forming the first mask layer 11 may include forming a first mask material layer on the semiconductor substrate 10; and forming a patterned photoresist layer on the first mask material layer, followed by etching the first mask material using the patterned photoresist layer as an etching mask. After forming the first mask layer 11, the patterned photoresist layer may be removed.

The first mask material layer may be made of any appropriate material, such as silicon oxide, silicon nitride, silicon oxynitride, amorphous carbon, or a combination thereof. In one embodiment, the first mask material layer is made of silicon nitride.

The first mask material layer may be etched by any appropriate process, such as a dry etching process, or a wet etching process, etc. The patterned photoresist layer may be removed by any appropriate process, such as a dry etching process, a wet etching process, or a plasma ashing process, etc.

Figure 3:
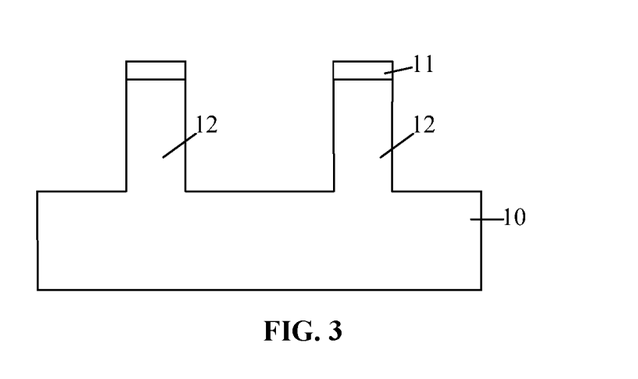

Returning to FIG. 14, after forming the first hard mask layer 11, a plurality of fins may be formed (S102). FIG. 3 illustrates a corresponding semiconductor structure.

As shown in FIG. 3, a plurality of fins 12 are formed on the semiconductor substrate 10. The fins 12 may protrude from the surface of the semiconductor substrate 10. For illustrative purposes, two fins 12 are illustrated in FIG. 3.

The fins 12 may be formed by etching the semiconductor substrate 10 using the first mask layer 11 as an etching mask to a predetermined depth. Thus, the fins 12 and the semiconductor substrate 10 may be a one whole body structure. The substrate 10 may be etched by any appropriate process, such as a dry etching process, or a wet etching process, etc. In one embodiment, a dry etching process is used to etch the semiconductor substrate 10 to form the plurality of fins 12. The etching gas of the dry etching process may include a fluoride-containing gas, such as $CF_4$, or $NF_3$, etc.

Referring to the FIG. 3, the widths of the trenches between adjacent fins 12 may be identical, or may be different. The detailed structures of the plurality of fins 12 may be designed according to different device performances.

Figure 5:
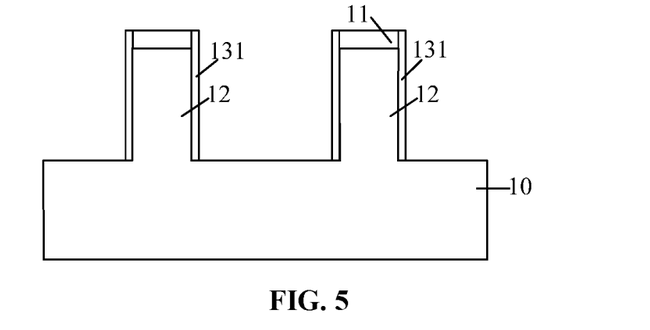

Returning to FIG. 14, after forming the fins 12, a second mask layer may be formed (S103). FIG. 5 illustrates a corresponding semiconductor structure.

As shown in FIG. 5, a second mask layer 131 is formed on the side surfaces of the fins 12. The second mask layer 131 may expose the surface of the semiconductor substrate 10 between the adjacent fins 12.

Figure 4:
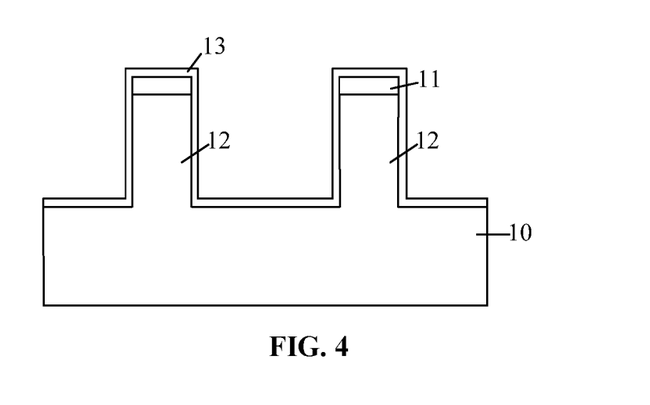

The process for forming the second mask layer 131 may include forming a second sidewall spacer material layer 13 (as shown in FIG. 4) on the top surfaces and the side surfaces of the fins 12 and the surface of the semiconductor substrate 10, followed by performing a self-aligning etching process to remove portions of the second mask material layer 13 on the surface of the semiconductor substrate 10 between adjacent fins 12 (as shown in FIG. 5). Thus, the second mask layer 131 may be formed on the side surfaces of the fins 12 and the side surfaces of the first mask layer 11.

The second mask material layer 13 may be made of any appropriate material. In one embodiment, the second mask material layer 13 is made of silicon nitride.

Various processes may be used to form the second mask material layer 13, such as a chemical vapor deposition (CVD) process, a physical vapor deposition (PVD) process, an atomic layer deposition (ALD) process, or a flowable CVD (FCVD) process, etc. In one embodiment, the second mask material layer 13 is formed by a CVD process. The self-aligning etching process may be any appropriate process, such as a dry etching process, or a wet etching process, etc.

Figure 7:
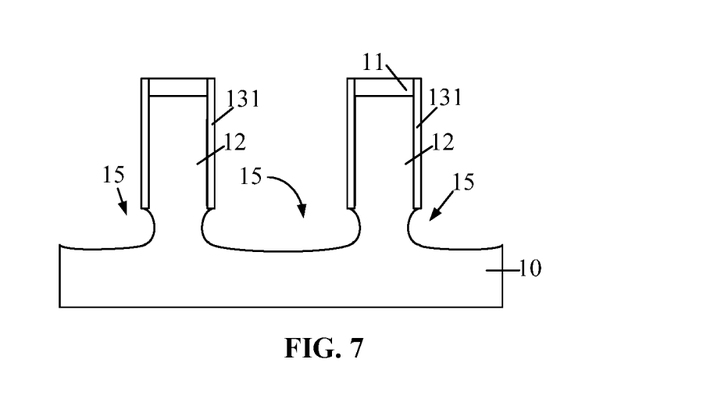

Returning to FIG. 14, after forming the second mask layer 131, a plurality of insulation layer trenches may be formed (S104). FIG. 7 illustrates a corresponding semiconductor structure.

As shown in FIG. 7, a plurality of insulation layer trenches 15 are formed in portions of the semiconductor substrate 10 between adjacent fins 12. Specifically, one insulation layer trench may be formed in the semiconductor substrate 10 between two adjacent fins 12. The insulation layer trenches 15 may be used to subsequently form an insulation layer.

In one embodiment, the insulation layer trenches 15 may extend to the bottoms of the fins 12. Such a shape may facilitate to subsequently form the insulation layer under the fins 12.

Figure 6:
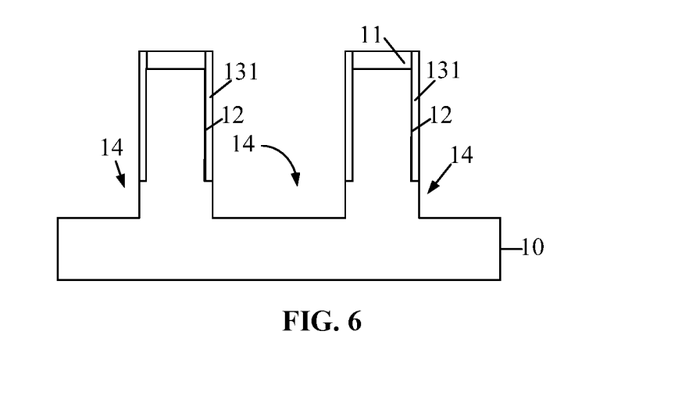

The process for forming the insulation layer trenches 15 may include forming trenches 14 in the semiconductor substrate 10 between adjacent fins 12 by etching the semiconductor substrate 10 using the first mask layer 11 and the second mask layer 131 as an etching mask (as shown in FIG. 6), followed by further etching the trenches 14 to form the insulation trenches 15 using the first mask layer 11 and the second mask layer 131 as an etching mask.

The etching process used for forming the first trenches 14 may be any appropriate etching process. In one embodiment, a dry etching process is used to etch the semiconductor substrate 10 to form the first trenches 14.

Specifically, a fluoride-containing gas, such as $CF_4$, or $NF_3$, etc., may be used as the etching gas of the dry etching process. The flow rate of the etching gas may be in a range of approximately 10 sccm-2000 sccm. The pressure of the dry etching process may be in a range of approximately 0.01 mTorr-50 mTorr. The power of the dry etching process may be in a range of approximately 50 W-10000 W.

Any appropriate processes may be used to further etch the trenches 14 to form the insulation layer trenches 15. In one embodiment, to broaden the first trenches 14 to form the insulation layer trenches 15, the etching process may be an isotropic etching process. In one embodiment, a wet etching process is used to form the insulation layer trenches 15. The wet etching process may be an isotropic etching process. Thus, during the wet etching process, the first trenches 14 may be extended under the fins 12 with a predetermined scale; and the insulation layer trenches 15 may be formed.

The etching solution of the wet etching process may include any appropriate chemicals. In one embodiment, diluted HF solution is used for the wet etching process. In the diluted HF solution, the volume ratio between HF and water may be in a range of approximately 1:300-1:1000. The temperature of the wet etching process may be in a range of approximately 0-100° C.

Figure 8:
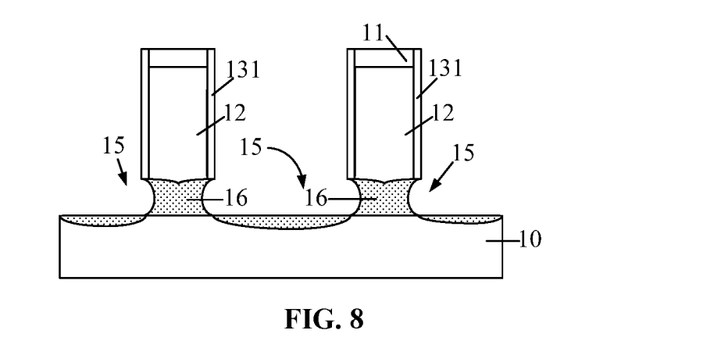

Returning to FIG. 14, after forming the insulation trenches 15, a plurality of silicon oxide layers may be formed (S105). FIG. 8 illustrates a corresponding semiconductor structure.

As shown in FIG. 8, a plurality of silicon oxide layers 16 are formed on the side surfaces of the insulation layer trenches 15. That is, one silicon layer 16 may be formed on one side surface of one insulation layer trenches 15. Further, the silicon oxide layers 16 may be formed under the fins 12. The silicon oxide layers 16 may also be formed on the surface of the semiconductor substrate 10 exposed by the insulation layer trenches 15.

The silicon oxide layers 16 may be formed by any appropriate process. In one embodiment, the silicon oxide layers 16 are formed by an oxidation process. Specifically, the reaction gas of the oxidation process may include oxygen, etc. The temperature of the oxidation process may be in a range of approximately 100° C.-1000° C. The pressure of the oxidation process may be in a range of approximately 0.01 Torr-50 Torr. The power of the oxidation process may be in a range of approximately 50 W-10000 W.

Figure 9:
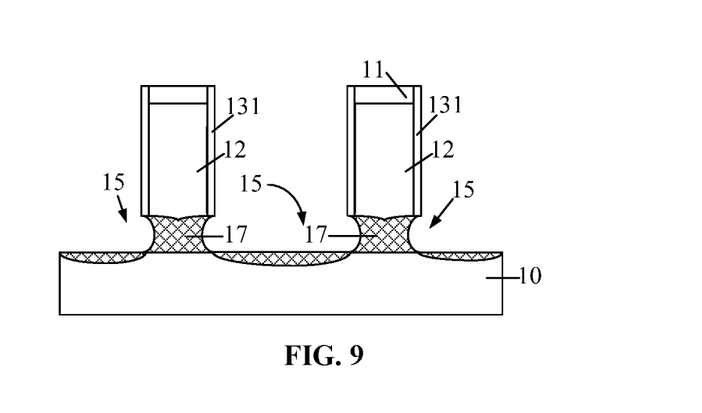

Returning to FIG. 14, after forming the plurality of silicon oxide layers 16, a plurality of first nitrogen-doped silicon oxide layers may be formed (S106). FIG. 9 illustrates a corresponding semiconductor structure.

As shown in FIG. 9, a plurality of first nitrogen-doped silicon oxide (SiON) layers 17 are formed. The first SiON layers 17 may be formed by doping nitrogen into the silicon oxide layers 16. Thus, the silicon oxide layers 16 may be converted into the first SiON layers 17.

The process for forming the first SiON layers 17 may be referred to as a nitridation process. Specifically, the silicon oxide layers 16 may be treated by a nitrogen plasma; and nitrogen atoms may be doped into the silicon oxide layers 16. Thus, the first SiON layers 17 may be formed.

Specifically, the nitrogen plasma treatment process may include introducing $N_2$, $NH_3$, or $N_2H_4$, etc., into a plasma generator to form a nitrogen plasma; and the nitrogen plasma may interact with the silicon oxide layers 16. During the plasma treatment process, the flow rate of $N_2$, $NH_3$, or $N_2H_4$, etc. may be controlled in a range of approximately 20 sccm-2000 sccm; the pressure may be controlled in a range of approximately 0.01 Torr-50 Torr; and the power of the plasma may be in a range of approximately 50 W-10000 W.

Figure 10:
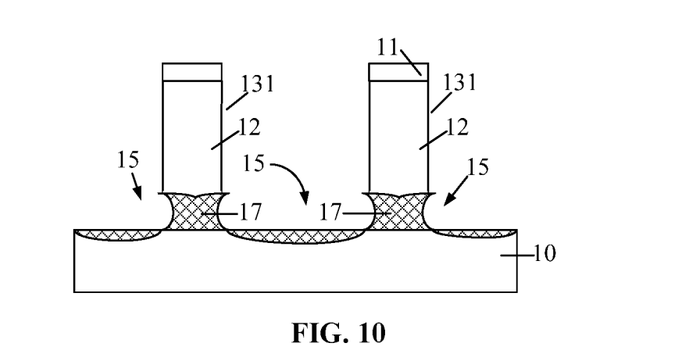

Returning to FIG. 14, after forming the SiON layers 17, the second mask layer 131 may be removed (S107). FIG. 10 illustrates a corresponding semiconductor structure.

As shown in FIG. 10, the second mask layer 131 is removed. In one embodiment, the second mask layer 131 is made of silicon nitride; and a nitrogen-doped silicon oxide layer may be subsequently formed in the insulation layer trenches 15. Thus, the second mask layer 131 may need to be removed before forming the nitrogen-doped silicon so as to reduce the damages to the nitrogen-doped silicon oxide layer caused by removing the second mask layer 131. Accordingly, the performance of the subsequently formed insulation layer having nitrogen-doped silicon oxide layer may be improved.

The second mask layer 131 may be removed by any appropriate process. In one embodiment, a wet etching process is used to remove the second mask layer 131. The etching solution of the wet etching process may include any appropriate chemicals. In one embodiment, phosphorus acid may be used as the etching solution of the wet etching process.

During the process for removing the second mask layer 131, a portion of, or the entire first mask layer 11 may be removed. But the consumption of the first mask layer 11 may not affect the performance of the semiconductor device.

Figure 11:
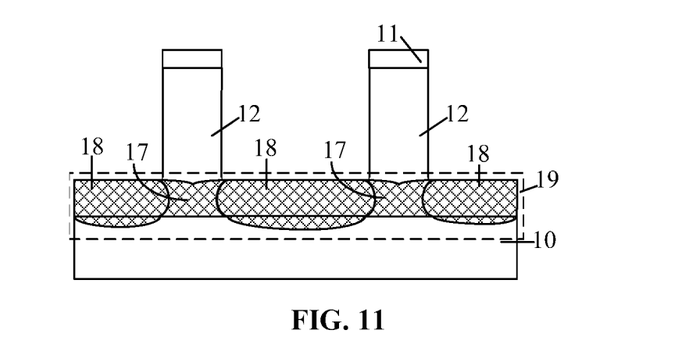

Returning to FIG. 14, after removing the second mask layer 131, a second nitrogen-doped silicon oxide layer may be formed (S108). FIG. 11 illustrates a corresponding semiconductor structure.

As shown in FIG. 11, a second nitrogen-doped silicon oxide layer 18 is formed in the insulation layer trenches 15. The second nitrogen-doped silicon oxide layer 18 may be formed by filling nitrogen-doped silicon oxide into the insulation layer trenches 15. The second nitrogen-doped silicon oxide layer 18 and the first nitrogen-doped silicon oxide layer 17 may together form an insulation layer 19 (the dashed line region).

The fins 12 may expose the insulation layer 19. The thickness of the insulation layer 19 may be in a range of approximately 2 Å-200 Å.

Various processes may be used to form the second nitrogen-doped silicon oxide layer 18. In one embodiment, the second nitrogen-doped silicon oxide layer 18 is formed by a CVD process.

Thus, in one embodiment, a plurality of fins 12 may be formed on the semiconductor substrate 10; and a plurality of insulation layer trenches 15 may be formed in the semiconductor substrate 10. After the oxidation process and the nitridation process, a plurality of first nitrogen-doped silicon oxide layers 17 may be formed in the plurality of insulation trenches 15. Further, after filling the insulation trenches 15 with nitrogen-doped silicon oxide, a second nitrogen-doped silicon oxide layer 18 may be formed in each of the insulation trenches 15. One second nitrogen-doped silicon oxide layer 18 may connect with two adjacent first nitrogen-doped silicon oxide layers 17 to form the insulation layer 19. The insulation layer 19 may inhibit the short-channel effect; and reduce the leakage current between the source and the drain.

Thus, a semiconductor device may be formed; and a corresponding semiconductor device is illustrated in FIG. 11. As shown in FIG. 11, the semiconductor device may include a semiconductor substrate 10, and an insulation layer 19 formed over the semiconductor substrate 10. Further, the semiconductor device may also include a plurality of fins 12 on the insulation layer 19. The plurality of fins 12 and the semiconductor substrate 10 may be one whole body. That is, the plurality of fins 12 may be formed by etching the semiconductor substrate 10.

After forming the insulation layer, a gate structure may be formed on the semiconductor substrate. The gate structure may cross over at least one fin; and cover the side surfaces and the top surface of the at least one fin. Further, after forming the gate structure, certain ions be doped into portions of the fin exposed by the gate structure at both sides of the gate structure to form a source and a drain in the fin at each side of the gate structure, respectively.

Figure 12:
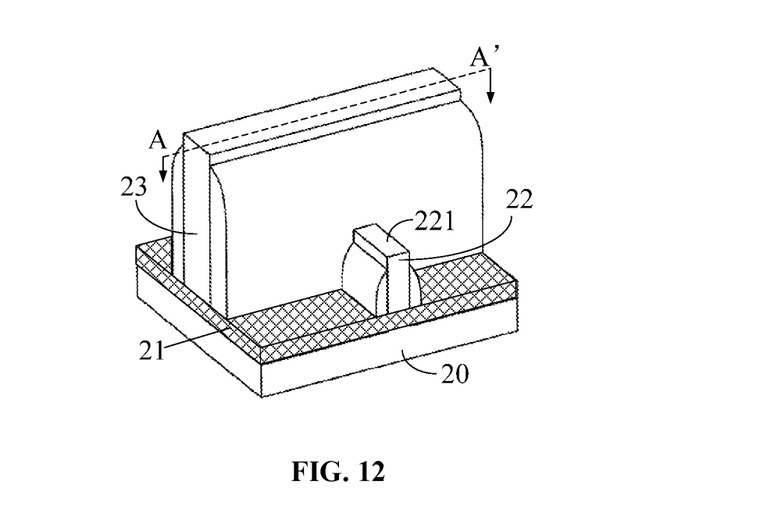
FIGS. 12-13 illustrate an exemplary FinFET consistent with the disclosed embodiments.
Figure 13:
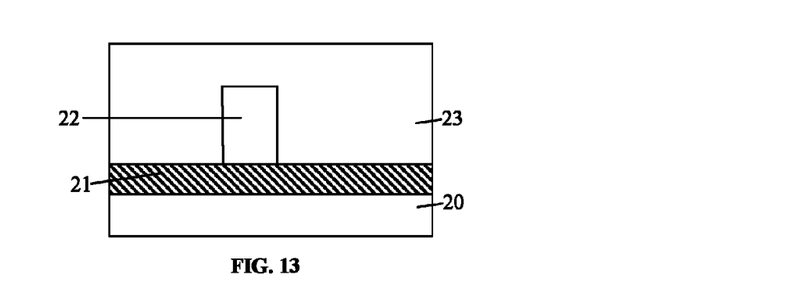

Thus, a FinFET may be formed by the disclosed methods and processes. The corresponding FinFET is illustrated in FIGS. 12-13. FIG. 13 illustrates a cross-sectional view of the structure illustrated in FIG. 12 along the A-A' direction.

As shown in FIGS. 12-13, the FinFET may include a semiconductor substrate 20, and an insulation layer 21 formed over the semiconductor substrate. The FinFET may also include a plurality of fins 22 formed over the insulation layer 21; and a gate structure 23 formed over the semiconductor substrate 10. The gate structure 23 may cross over at least one fin 12; and may cover the top and side surfaces of the fin 22. Further, the FinFET may also include a source 221 formed in the fin 22 at one side of the gate structure 22 and a drain 221 formed in the fin 22 at the other side of the gate structure 22.

According to the disclosed methods and structures, after forming a plurality of fins by etching a semiconductor substrate, a mask layer may be formed on side surfaces of the plurality of fins. Then, a plurality of insulation layer trenches may be formed in the semiconductor substrate by etching the semiconductor substrate using the mask layer as an etching mask. Then, the side surfaces of the insulation layer trenches may be oxidized to form silicon oxide layers under the plurality of fins; and nitrogen may be doped into the silicon oxide layers to form first nitrogen-doped silicon oxide layers. Then, second nitrogen-doped silicon oxide layers may be formed by filling the insulation layer trenches with nitrogen-doped silicon oxide. The second nitrogen-doped silicon oxide layers and the first nitrogen-doped layers may form an insulation layer.

Thus, the plurality of fins and the semiconductor substrate may be one whole body. At the same time, the insulation layer made of nitrogen-doped silicon oxide may be formed under the gate and the channel region of the FinFET. During the operation of the FinFET, the insulation layer may inhibit the short-channel effect; and reduce the leakage current between the source and the drain.

Further, the insulation layer may be made of nitrogen-doped silicon oxide. Thus, the heat dissipation efficiency of the insulation layer may be enhanced. Accordingly, the heat dissipation efficiency of the FinFET may be improved; and the performance of the FinFET may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
   providing a semiconductor substrate having a surface;
   forming at least one fin over the surface of the semiconductor substrate;
   forming a mask layer on side surfaces of the fin;
   forming insulation layer trenches in the semiconductor substrate by etching the semiconductor substrate using the mask layer as an etching mask;
   forming silicon oxide layers on side surfaces of the insulation layer trenches under the fins and a lower portion of the fin;
   forming first nitrogen-doped oxide layers by doping nitrogen into the silicon oxide layers; and
   filling the insulation layer trenches with nitrogen-doped silicon oxide to form second nitrogen-doped silicon oxide layers, the first nitrogen-doped silicon oxide layers and the second nitrogen-doped silicon oxide layer form an insulation layer under the fin.

2. The method according to claim 1, wherein:
   the silicon oxide layers are formed by an oxidation process.

3. The method according to claim 2, wherein:
   a reaction gas of the oxidation process is oxygen;
   a temperature of the oxidation process is in a range of approximately 100° C.-1000° C.;
   a flow rate of the reaction gas is in a range of approximately 20 sccm-2000 sccm;
   a pressure of the oxidation process is in a range of approximately 0.01 Torr-50 Torr; and
   a power of the oxidation process is in a range of approximately 50 W-10000 W.

4. The method according to claim 1, wherein forming the insulation layer trenches comprises:
   forming first trenches in the semiconductor substrate by etching the semiconductor substrate using the mask layer as an etching mask; and
   extending side surfaces of the first trenches under the fin.

5. The method according to claim 4, wherein:
   the first trenches are formed by a dry etching process; and
   the side surfaces of the first trenches are extended by a wet etching process.

6. The method according to claim 5, wherein:
   an etching gas of the dry etching process includes one of $CF_4$ and $NF_3$;
   a flow rate of the etching gas is in a range of approximately 10 sccm-2000 sccm;
   a pressure of the dry etching process is in a range of approximately 0.01 mTorr-50 mTorr; and
   a power of the dry etching process is in a range of approximately 50 W-10000 W.

7. The method according to claim 5, wherein:
   an etching solution of the wet etching process is a diluted HF solution; and
   a volume ratio of HF and water in the diluted HF solution is in a range of approximately 1:300-1:1000.

8. The method according to claim 1, wherein forming the first nitrogen-doped layers comprises:
   generating a nitrogen plasma to treat the silicon oxide layers, and doping nitrogen into the silicon oxide layers.

9. The method according to claim 8, wherein generating the nitrogen plasma comprises:
   introducing one of $N_2$, $NH_3$ and $N_2H_2$ into a plasma generator.

10. The method according to claim 9, wherein:
    a flow rate of one of $N_2$, $NH_3$ and $N_2H_2$ is in a range of approximately 20 sccm-2000 sccm;

a pressure in the plasma generator is in a range of approximately 0.01 Torr-50 Torr; and a power of the plasma generator is in a range of approximately 50 W-10000 W.

11. The method according to claim 1, before filling the nitrogen-doped silicon oxide into the insulation layer trenches, further comprising:

removing the mask layer.

12. The method according to claim 11, wherein:

the mask layer is made of silicon nitride; and the mask layer is removed by a wet etching process using phosphoric acid as an etching solution.

13. The method according to claim 11, wherein:

a thickness of the insulation layer is in a range of approximately 2 Å-200 Å.

14. A method for fabricating a fin field-effect transistor according to claim 1, further comprising:

forming a gate structure crossing over the fin, and covering top and side surfaces of the fin over the semiconductor substrate; and forming a source in the fin at one side of the gate structure and a drain in the fin at another side of the gate structure.

* * * * *